US006601208B2

(12) United States Patent
Wu

(10) Patent No.: US 6,601,208 B2
(45) Date of Patent: Jul. 29, 2003

(54) FORWARD ERROR CORRECTION TECHNIQUES

(76) Inventor: William W. Wu, 6012 Valerian La., Rockville, MD (US) 20852

( * ) Notice: Subject to any disclaimer, the term of this patent is extended or adjusted under 35 U.S.C. 154(b) by 0 days.

(21) Appl. No.: 09/835,361

(22) Filed: Apr. 17, 2001

(65) Prior Publication Data

US 2003/0023918 A1 Jan. 30, 2003

(51) Int. Cl.[7] ............................ H03M 13/00; H04J 3/24
(52) U.S. Cl. ........................ 714/752; 714/785; 370/474
(58) Field of Search ................................. 370/474, 310, 370/338, 522, 412, 428; 714/774, 751, 786, 752, 758, 712; 709/102, 104, 201, 225, 229; 380/210

(56) References Cited

U.S. PATENT DOCUMENTS

| | | | | |
|---|---|---|---|---|
| 5,648,969 A | * | 7/1997 | Pasternak et al. | ............ 370/349 |
| 5,699,365 A | * | 12/1997 | Klayman et al. | ............ 714/708 |
| 5,936,949 A | * | 8/1999 | Pasternak et al. | ......... 370/310.1 |
| 6,349,138 B1 | * | 2/2002 | Doshi et al. | ................. 380/200 |

OTHER PUBLICATIONS

Wu, W.W., *New Convolutional Codes*; IEEE Transactions on Communications Technology; Part I, COM–23, No. 9; Sep. 1975 pp. 942–956; Part II, COM–24, No. 1; Jan., 1976 pp. 19–33; Part 3, COM–24, No. 9, Sep., 1976, pp. 946–955.
Wu, W.W.; Haccoun, D.; Peile, R.; and Hirata, Y.; *Coding for Satellite Communications*, IEEE Journal on Selected Areas in Communications, vol. 5, No. 4; May 1987, pp. 724–748.
Calderbank, A.R.; *The Art of Signalling: Fifty Years of Coding Theory*; IEEE Transactions in Information Theory; vol. 44, No. 6; 1998 pp. 2561–2593.
Costello, D.J, Hagenauer, J., Imai, H., and Wicker, S..; *Applications of Error–Control Coding*; IEEE Transactions on Information Theory; vol. 44, No. 6; Oct. 1998 pp. 2531–2559.

* cited by examiner

*Primary Examiner*—Christine T. Tu
(74) *Attorney, Agent, or Firm*—James Creighton Wray; Meera P. Narasimhan

(57) ABSTRACT

Forward error correction techniques are applied and imbedded in the designated spaces of all the Internet Transmission Protocols in the Application Layer, the Transport Layer, the Network Layer, and the Link Layer. Encoding methods are performed at the transmitting end and corresponding decoding algorithms are performed at the receiving end. Error correcting codes are used at the receiving end to check and correct the received transmissions. This invention achieves significant better performance and quality of service (QoS) in terms of capacity amelioration, efficiency enhancement, reliability improvement, message delay reduction, bandwidth conservation, faster signaling, and the prevention of traffic congestion. The results are obtained effortlessly, simply, and simultaneously. All the above attributes are accomplished without adding complexity for each improvement. The methods to accomplish such features is through specific forward error corrections by means of replacement Checksums, CRCs, and ARQs for all the Internet Transmission Protocols without a single digit change from the established International Standards. By the unique method of converting all blockless convolutional codes to block codes and a set of eight particular newly derived and designed block codes, all the Internet transmission protocols are covered.

15 Claims, 9 Drawing Sheets

Location and Utilization of FEC in Internet Transmission

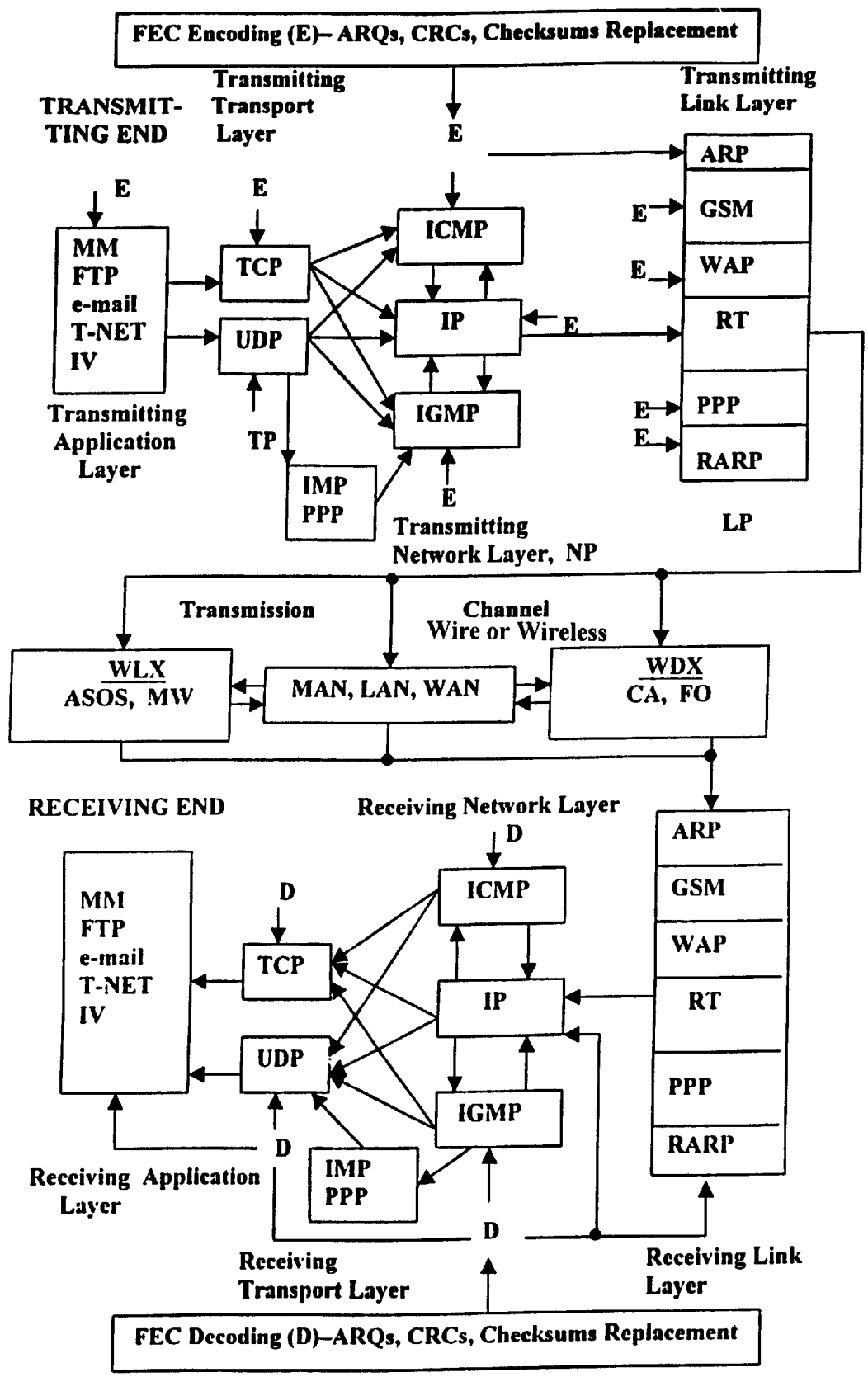
FIG. 1  Location and Utilization of FEC in Internet Transmission

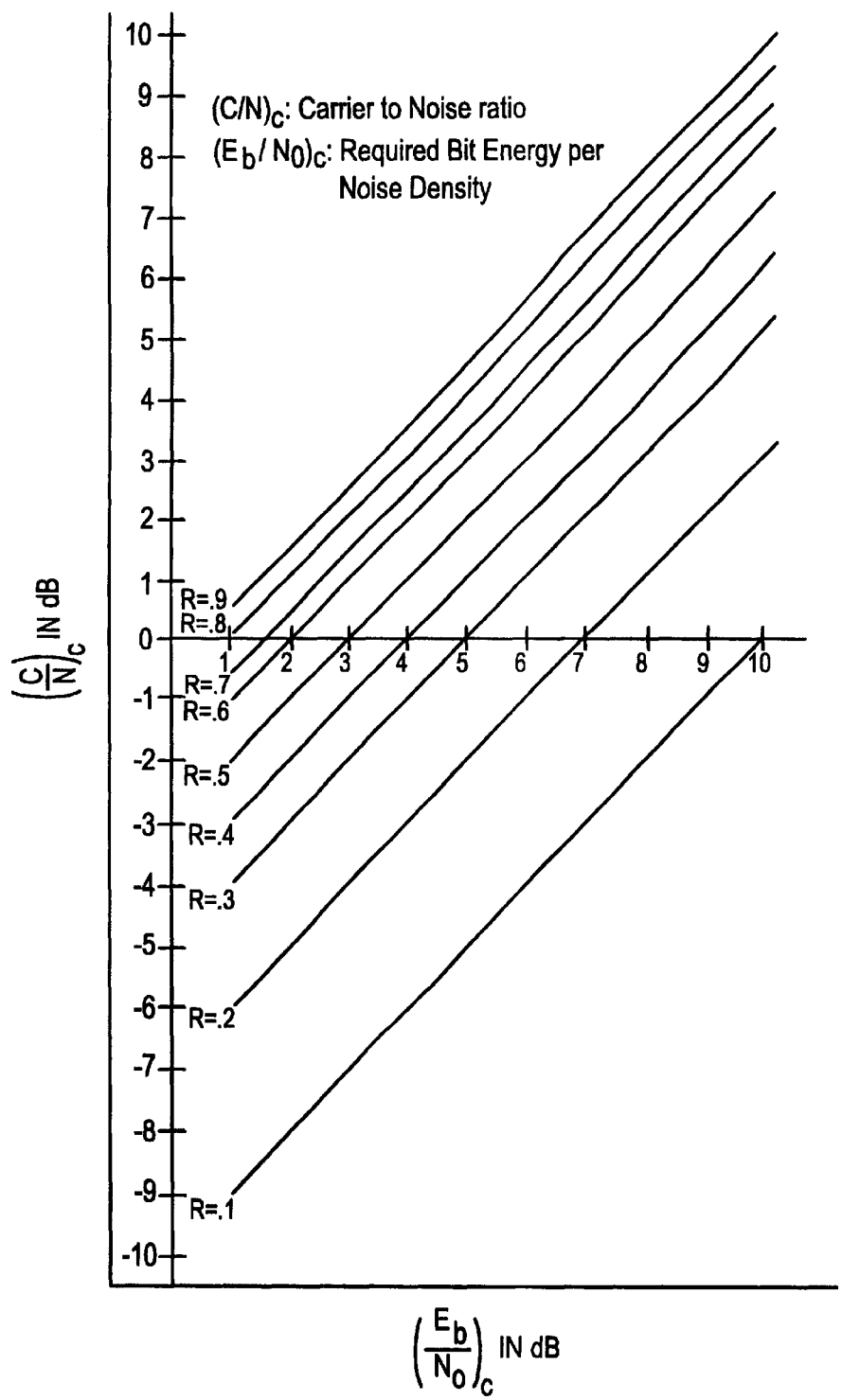

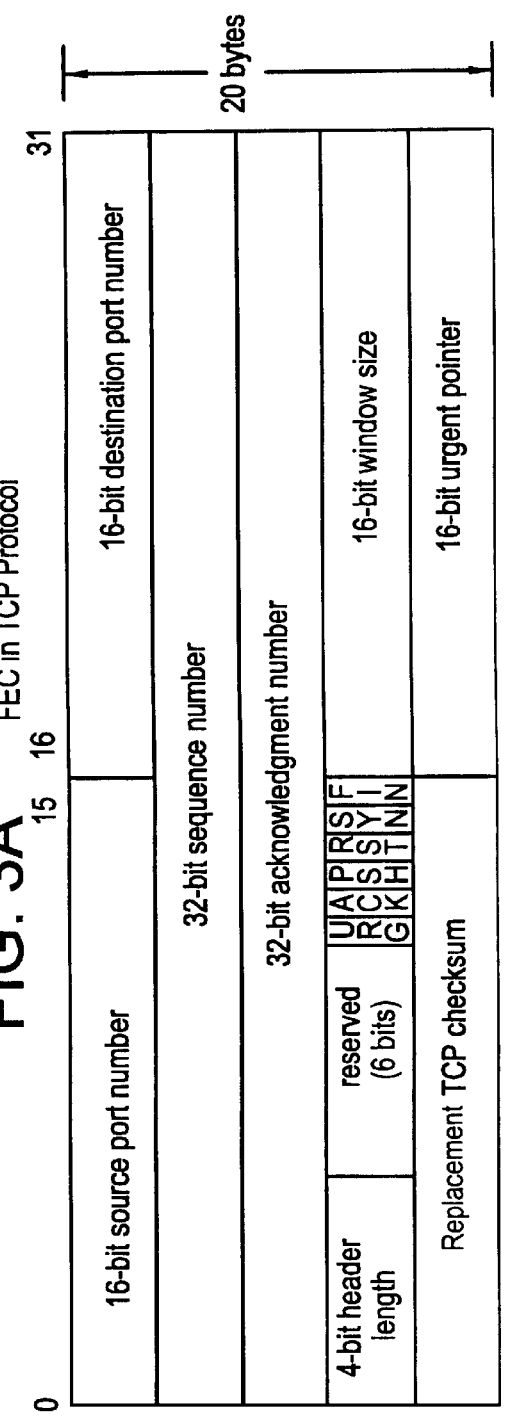
FIG. 3A  FEC in TCP Protocol
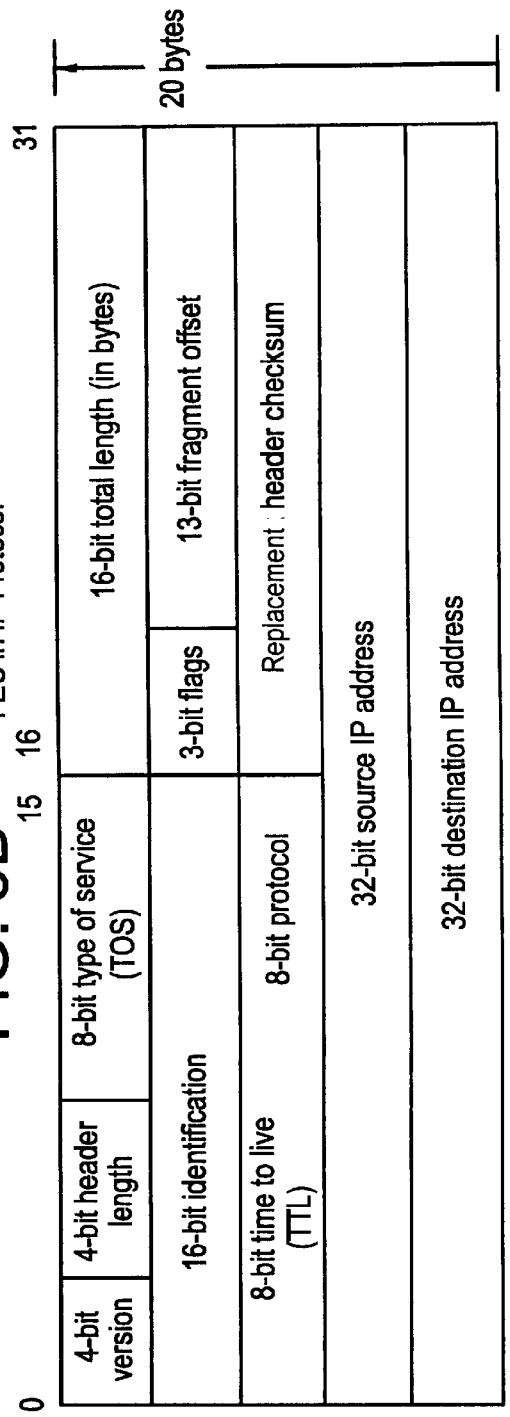
FIG. 3B  FEC in IP Protocol

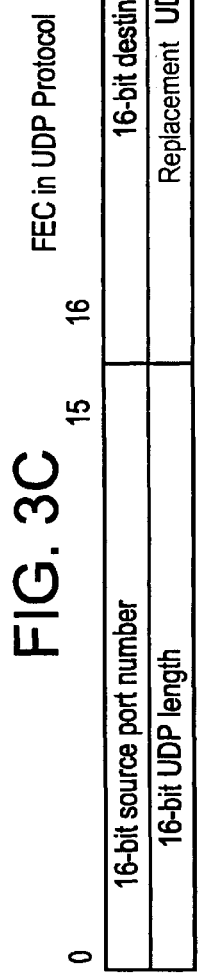
FIG. 3C  FEC in UDP Protocol
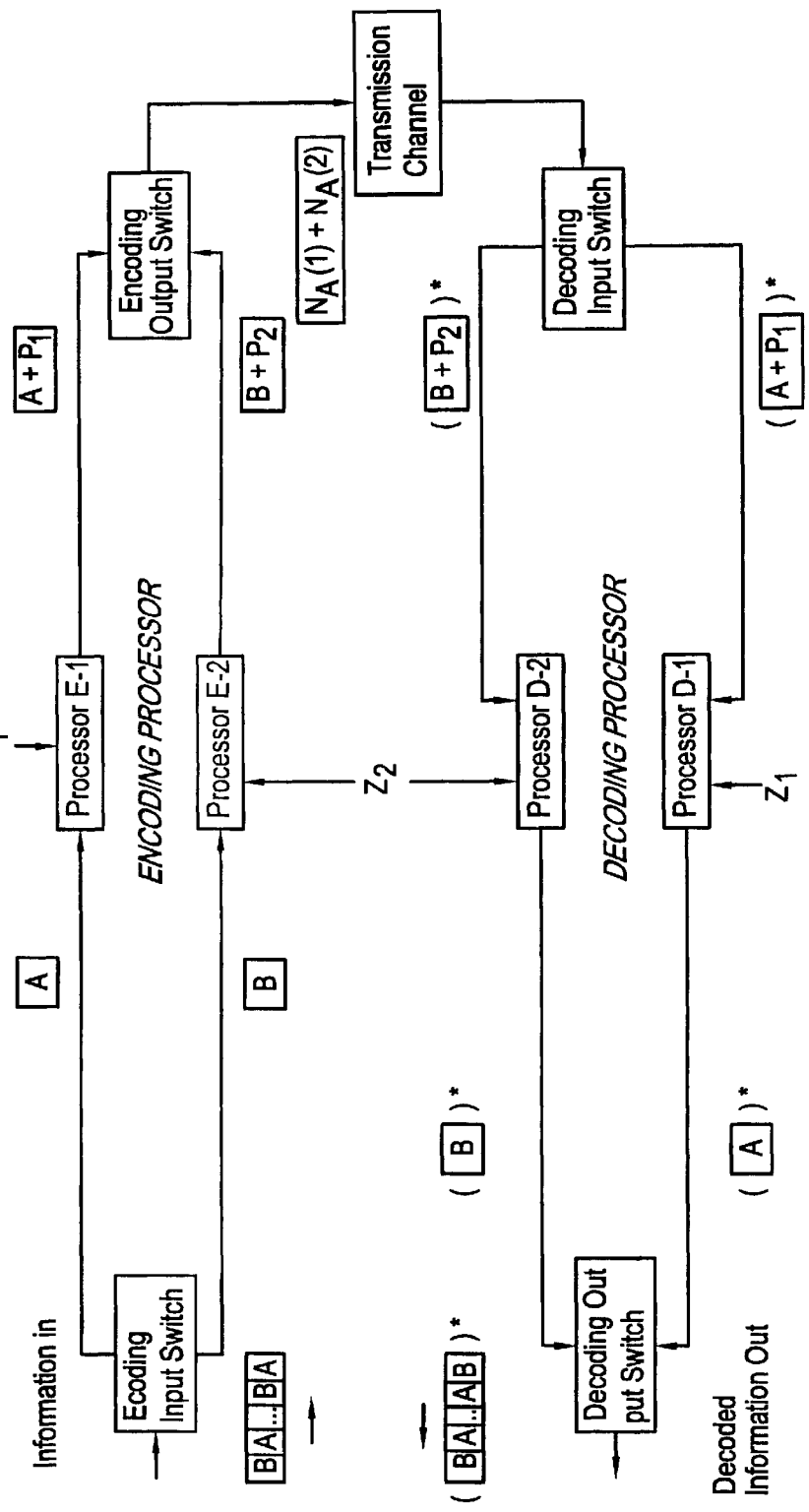
FIG. 4  Conversion from Blockless Convolutional Codes to Block Codes Encoding Processor E-1, E-2

Decoding Processor D-1, D-2

Encoder II Shift Register Connections

Test Configuration Block Diagram

Programmable Error Patterns

Internet Transmission Links

Internet Transmission Model with Wired or Wireless Links

Channel Capacity of an Internet Transmission Link with ISP $P_2 = 10^{-5}$

FORWARD ERROR CORRECTION TECHNIQUES

GOVERNMENT SUPPORT

The work is based on a National Science Foundation Grant—Small Business Innovation Research Program, Number: DMII-9960040, Jun. 30, 2000.

BACKGROUND

1. Field of Invention

The field of this patent is in the area of forward error correction and its applications.

2. Description of Related Art

All information transmission protocols are block structured. Block structured block codes are standardized for error detection and re-transmission.
Block codes, particular short code lengths, are scarce and less powerful.
convolutional codes are known to produce a large number of optimal block codes
All Internet transmission relies on a set of transmission protocols.
All Internet transmission protocols rely on error detection and re-transmission, or error detection without re-transmission
The Internet Transmission Protocols For transmission, the key mechanism of the Internet is the following set major protocols:

TCP (Transmission Control Protocol),
(Internet Protocol),
ICMP (Internet Control Message Protocol),
IGMP (Internet Group Management Protocol),
PPP (Point to Point Protocol)
FTP, TFTP (Trivial File Transfer Protocol),
UDP (User Datagram Protocol),
IMP (Internet Multicast Protocol),
Under ICMP, there exists transmission protocols for address, timestamp request and reply, router solicitation, router advertisement, Echo request and reply, timing exceeded messages, redirected messages, and unreachable messages. Each transmission protocol has its unique format and structure, and they have been specified by the IETF as standards. Each of these protocols contains the provision of either Checksum, or ARU, or CRC for error detection and/or re-transmission.
Error Detection and/or Re-transmission For error protection, telecommunication industry depends on error detection and re-transmission. All present and planned Internet transmission schemes rely on either error detection or re-transmission, or no error detection but waiting for delayed non-response time. The error detection and re-transmission techniques have been referred to as automatic repeat request (ARQ). The delayed response and re-transmission schemes have been referred to as the Windowed method. The Window size, specified by the IETF (Internet Engineering Task Force) and practiced by all the ISPs (Internet Service Providers), is related to the amount of delay time allowed.

All ARQ use error codes without forward correction capability. These ARQ codes are selected, internationally standardized, and called CRC (Cyclic Redundancy Checks). The generator polynomials of the CRC codes are:

$$\begin{aligned} g(CRC\text{-}4) &= 1 + x + x^2 + x^3 + x^4 \\ g(CRC\text{-}7) &= 1 + x^4 + x^6 + x^7 \\ g(CRC\text{-}8) &= (1+x)(1+x+x^2)(1+x^2+x^3+x^4+x^5) \\ g(CRC\text{-}12) &= 1 + x + x^2 + x^3 + x^{11} + x^{12} \\ g(CRC\text{-}16a) &= 1 + x^2 + x^{15} + x^{16} \\ g(CRC\text{-}16b) &= 1 + x^5 + x^{12} + x^{16} \\ g(CRC\text{-}16c) &= 1 + x + x^2 + x^4 + x^7 + x^{13} + x^{15} + x^{16} \\ g(CRC\text{-}24) &= 1 + x^8 + x^{12} + x^{14} + x^{23} + x^{24} \\ g(CRC\text{-}32) &= 1 + x + x^2 + x^4 + x^5 + x^7 + x^8 + x^{10} + x^{11} + \\ &\quad x^{12} + x^{16} + x^{23} \end{aligned} \tag{1}$$

The CRC-16a has been standardized by ANSI. The CRC-16b has been standardized by the ITU-T and widely used worldwide. The CRC-16c has been standardized for SDLC. For CRC-32 there exist two more versions depending on the applications. For the Internet transmission, some protocols have specified one or more of the above CRCs. But most Internet Transmission Protocols rely on the structure of Checksums for error protection as to be described next.
The Checksum Computations Based on ordinary arithmetic computations in computers the technique of Checksum was developed based on arithmetic coding. In this case, the numbers are represented by a set of polynomials in a radix system. For every such number, there is a unique binary representation in terms of the powers of the radix=2 and coefficients +1, −1, or 0. To encode a number n, multiply n by a factor of the radix r, then add a value b. That is, the coded form is c=nr+b. To decode, the decoder first subtract b from c, then divide by r. If the division produces a nonzero remainder, an error is detected. The condition here requires that n is relatively prime to r.

Presently, the Internet uses 16-bit bytes in its Checksum portion of all the transmission protocol formation. The Checksum function is the one's complement sum. That is, additions are performed with arithmetic carry on the bytes. It is the one's complement of this sum that is stored in all the protocols, which contains Checksums. For Checksums the radix base r is chosen to be $2^{16}$. This way, every 16-bit byte is considered as a digit of a number, and this number is the message.

The implementation of the Internet Checksum is the result of conversion of the division computation to addition. This is based on the following identity valid for $r=2^{16}-1$ and any digit D in radix r:

$$D*r^j = D \bmod (r-1) \tag{2}$$

In the statement, any digit D in radix r multiply any power of the radix will have a remainder D when divided by the radix minus one. Thus, the remainder of a number divided by the radix minus one can be obtained by adding the digits of the number. Thus the required division process becomes addition operation and the decoding in Checksum becomes summing all the 16-bit words with carries. As a result, errors can be detected after the summation procedure.

The Checksum operation is described as:

Two adjacent 8-bit symbols are pair-wise checksum to form 16-bit integers.

The 1's complement sum of these 16-bit integers is then formed.

The 16-bit 1's complement sum is computed over the set of message symbols.

The 1's complement of this sum is the 16-bit Checksum for encoding.

To perform error detection, the 1's complement sum is computed over the same set of message symbols.

If the computed result is all 1's, (−0 in 1's complement arithmetic) check is completed.

Limitations and Problems

The severity of limitation and problem depends on the application, client's demand, server's availability, and network condition, at that time. In most cases, limitations and problems are separately treated and improvements are separately sought.

Network and Throughput Problems

The Internet network operators are using load balancing algorithms, scheduling techniques, renaming network elements, rotating servers, and user message behavior in order to optimize the network utilization. These algorithms and procedures require constant monitoring and updating. As a consequence, the operations not only become complicated and costly, but also decrease the network throughput.

Bandwidth and Congestion Problems

As the Internet traffic increases, congestion is expected, and bandwidth has been recognized as scarce commodity. In addition to loading balancing and message sensing methods, advance service such as Differential Service technique and its variation have been proposed in order to conserve bandwidth. But these techniques cause delay and create uncertainty and undesirability from a client's viewpoint.

Efficiency and Reliability Problems

Transmission protocols are the backbones of the Internet. There are four basic layers in protocol internetworking architecture: the Application Layer, the Transport Layer, the Inter-network Layer, and the Network Interface Layer. The last one is also called data link layer, which provides interface to the networks such as ATM, FDDI. The IP is the heart of the Inter-network Layer, which does not provide any measure of link reliability. The only error protection mechanism in the IP is a very simple error detection scheme for the protection of the Header.

At the receiving end, if an error is detected in the IP Header, the entire Header and the corresponding message are discarded. There is no provision for re-transmission request. Even in the absence of heavy user traffic, different time delay has been experienced when Internet is logged-on. This is due to either noise or interference in the transmission channel, and the IP keeps discarding the Header to prevent information with error.

There are three types of ARQ: Stop and Wait, Go Back-N, and Select Repeat. A transmission protocol assigns sequence numbers to each transmitted data block, and expects a positive acknowledgment from the Transport Layer from a receiver. If an acknowledgment is not received in a timely manner, the entire block is re-transmitted. This re-transmission protocol is a variation of the Select Repeat -ARQ. When a transmission channel is noisy, all transmission schemes based on ARQ become inefficient.

Presently, the Internet, based on the protocols, has not been able to provide high reliability and efficiency. If a feedback channel is available, repeated transmission decreases efficiency. If a feedback channel is not available, one takes a chance at the receiving end. For some transmission in real time, such as voice and video, and errors occur, it is not always feasible to stop in the middle and request for re-transmission.

Compatibility and Standards Problems

Standardization affects not only users, but also equipment manufacturers, and network operators. In the telecom industry, no matter how innovative the technology, how wonderful the product and how low the price, if it cannot be standardized, it cannot sell even if it is a bad standard. A product becomes marketable only when it can comply, with multiple existing standards.

Wireless standards come from IEEE 802.11 and are limited to physical layer and the common medium access control of wireless LAN. For the wireless Internet, the Internet Engineering Task Force (WETF) is working toward establishing standards for mobile internetworking through Internet Protocol version 6 (IPv6).

Delay and Speed Problems

One of the Next Generation Internet (NGI) goals is to increase the present Internet speed by a thousand fold. Most work in this area concerns with the speed of the devices and modems. None has investigated the delay and slow speed caused by re-transmission.

The problems and limitations are not limited to the Internet transmission. They are common to all information transmissions. As results of the above discussions, needs exist to overcome the limitations and problems in order to conserve bandwidth, reduce redundant traffic, enhance efficiency, minimize message delay, improve reliability, ameliorate transmission capacity, and increase transmission speed.

SUMMARY

This invention invents, derives, constructs forward error correction codes and designs, selects, evaluates, and tests the codecs (encoders/decoders). The invention either fully or partially eliminates all re-transmission schemes and replaces them with forward error corrections without replacing any standardized signaling formats.

This invention advances the state-of-the-art of optimally converting any convolutional code with any of its decoding methods to block structured block code.

As an example, this invention addresses the key elements of the Internet—the network transmission aspects of the Internet inner workings. The attributes, the impact, and the utilization of the invention are identified through the following seven attributes, which are achievable with single solution approach of this invention. The invention significantly impacts on:

Bandwidth conservation

Traffic congestion

Efficiency enhancement

Message delay reduction

Reliability improvement

Transmission channel capacity amelioration

Transmission speed increase

No other single solution is known capable of achieving all seven attributes simultaneously. No other solution is known to obtain each of the attributes effectively.

CHARACTERISTICS OF THE INVENTION

What make this invention different from others include:

Innovation

Beyond existing coding theories, this invention converts any convolutional code to a block code.

The invention provides ARQs, CRCs, and Checksums replacements by means of forward error-correcting codes.

The invention achieves in deriving new codes, modifying known codes, and selecting existing codes to meet all the requirements of the Internet transmission protocols.

Uniqueness

The invention produces simultaneously the following attributes in any information transmission: channel capacity amelioration, bandwidth conservation, throughput enhancement, reliability improvement, increase transmission speed, message delay reduction, and prevent traffic congestion.

The invention constructs unique test configuration with programmable error generation, and statistical error analyses.

Merit

The solutions advanced in this invention meet all the segmentation requirements of all the standardized Internet Transmission Protocols without a single bit alteration.

The approaches advanced in this invention are useful not limited to Internet.

BRIEF DESCRIPTION OF THE DRAWINGS

FIG. 1 shows the location and utilization of forward error corrections with respect to Internet Transmission Protocols.

FIG. 2 is the performance limit for all forward error-correcting codes,

FIG. 3(a) shows the TCP protocol.

FIG. 3(b) shows the IP protocol

FIG. 3(c) shows the UDP protocol

FIG. 4 diagrams the conversion process of convolutional codes to block codes.

DETAILED DESCRIPTION OF THE PREFERRED EMBODIMENTS

Methods and Limitation of the Invention

Figure 5A:
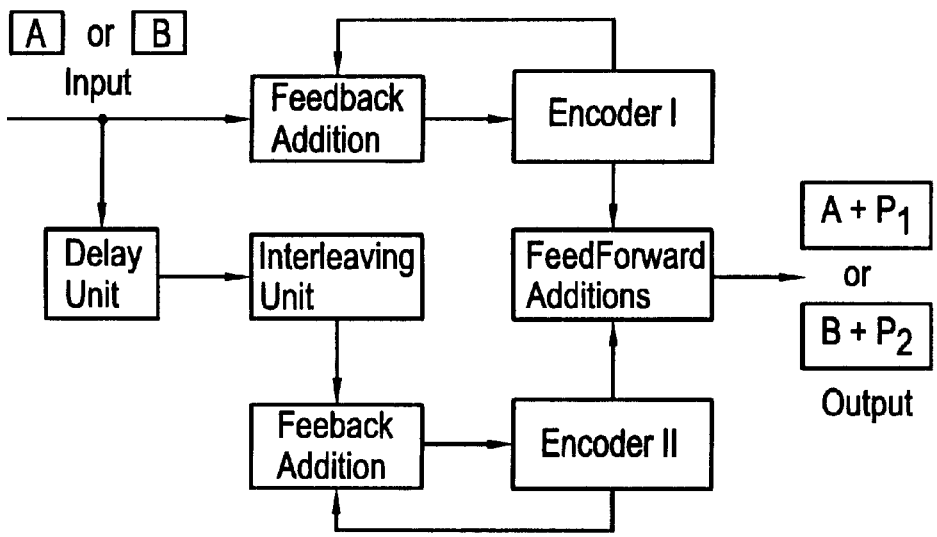
FIG. 5(a) shows the elements of the encoding conversion processor.

This invention introduces error correction techniques and specific forward error correcting codes, with encoder and decoder implementations, to replace all ARQs, all CRCs, and all Checksums of all information transmission protocols. With THE Internet, as an example, the implementation method is outlined in FIG. 1, which consists have transmit segment, receiving segment, transmission channel, the essential Internet Transmission Protocols, and the forward error correction encoding and decoding mechanism.

The transmit and receiving ends communicate in pairs in terms of Application Layer, which consists of: MM (multimedia), FTP (File Transfer Protocol), T-net (Telenet), IV (Internet voice); Transport Layer has TP (Transport Protocols), which consists of: TCP, UDP, IMP, PPP (see Section 4.2.1 for abbreviation); Network Layer has NP (Network Protocols), which consists of: ICMP, IGMP, and IP; Link Layer has LP (Link Protocols), which consists of: ARP (Address Resolution Protocols), GSM (Global System Mobile), WAP (Wireless Application Protocols), RT (routers), PPP, and RARP (Reverse Address Resolution Protocols).

The transmission channel can be MAN (metropolitan area networks), LAN (local area networks), WAN (wide area networks). These networks can be implemented with wired transmission (WDX) by means of cable (CA), fiber optical cable (FO), or wireless transmission (WLX), with ATM satellite onboard switches (ASOS) or any microwave (MW) media.

At the receiving end, all the protocol procedures is reversed. The Internet depends on the set of transmission protocols to acknowledge, arrange, to identify, to route, to sort, and to communicate among the servers and clients in the network.

At the top and bottom of FIG. 1, there are forward error correction (FEC) Encoding (E) and Decoding (D) functions, respectively. It is noted that Es are implemented into all the protocols in the transmit end, and the Ds are supplied to the transmission protocols in the receiving end. In practice, the Es and the Ds can be a permanent a part of the corresponding protocols, or call up in demand instantly. The Es and the Ds can be different depending on the specific protocol and specific ARQ, CRC, or Checksum. The details are described in the rest of Section VIII.

The basic methods are: replacement of feedback transmission with feed-forward transmission, or combine feedback with feed-forward transmission; replacement of error detection with error correction, or the combination of both error detection with error correction; The key mechanism of the invention is the replacement of all the ARQs, CRCs, and Checksums. During replacement processes, no single bit is added or deleted from the established standards. Forward error correcting codes are applied and imbedded in the designated spaces of all the Internet Transmission Protocols in the Application Layer, the Transport Layer, the Network Layer, and the Link Layer. Encoding are performed at the transmission end, and corresponding decoding algorithms are performed at the receiving end. The forward error correcting codes are transmitted with the protocols and information in the transmission channel and are received at the receiving end. At the receiving end, the forward error correcting codes are decoded and are used to check and correct the transmitted protocols and the information. The forward error correcting codes provided in one embodiment to the transmitting end with Internet protocols and are transmitted through the transmission channel with the Internet protocol in information packets. At the receiving end, the forward error correcting codes are decoded and the Internet protocols and the information in the packets are checked with the forward error correcting codes to check errors and correct errors.

FIG. 2 shows the performance limit for all forward error correcting codes in Additive Gaussian transmission channels. The performance limits are evaluated in terms of carrier to noise ratio against required bit energy signal to noise density ratio with encoding rates as parameters. The encoding rates are evaluated from 0.1 to 0.9. The performance limits include the newly derived, combined, and modified from the existing ones as claimed in this patent in Additive Gaussian transmission channel. For the purpose of clarification, numerical examples are provided for illustration. The invention is not limited by the examples.

Implementation Techniques

Among all the Internet Transmission Protocols, there are three protocols TCP, UDP, and IP as examples shown in FIG. 3(a, b, c). The protocols contain: a 16-bit TCP Checksum for TCP, a 16-bit UDP Checksum for UDP, and a 16-bit header Checksum for IP. Without altering the allocation, changing the location, adding or deleting a single bit of each protocol, this part of the invention is to introduce respective encoding and decoding schemes into the designated segments. The procedures are to replace all the Checksums in the three exampled protocols. Other transmission protocols, including the other Internet transmission protocol, contain ARQs, CRCs, and Checksums. The principle of replacement is the same. For variation of performance and matching compatibility, only the codes are different.

Identified in FIG. 1, the other Internet Transmission protocols are:

ICMP (Internet Control Message Protocol), which contain sub-protocols:

The ICPM Address consists of 16 bits each for identifier and sequence number, 32 bits subnet mask, and 16 bits for Checksum.

The format of the ICMP Timestamp Request and Reply consists of 32 bits each timestamp for originate, receive, and transmit. Same as in the ICMP Address, there are 16 bits each for identifier and sequence number, and 16 bits for Checksum.

Out of total 32 bits, 16 bits of Checksum are allocated for ICMP Router Solicitation.

The format of ICMP Router Advertisement consists of 8 bits each for type, code, number of addresses, address entry size; 16 bits each of Checksum and lifetime; 32 bits each for double router addresses and preference level.

The ICMP sub-protocol for Echo Request and Echo Reply has 64 bits and among them 16 bits each are allocated to Checksum, identifier, and sequence number. The other 8 bits each are provided for type and code.

Similar to ICMP Echo Request and Echo Reply, the format of ICMP Time Exceeded Message, ICMP Redirected Message, and ICMP Unreachable Message each contains an 8 bits type, 8 bits code, and also has a Checksum.

In the ICMP Redirect Message, 32 bits are allocated to router IP address. Re-direction consists of network direction, host direction, redirection for type-of-service and network, and redirection for type-of-service and host.

In the ICMP Unreachable Message sub-protocol, the usable portion of the protocol contains only 32 bits, half of it is devoted its own Checksum. There are 32 bits provisions for IP header and IP datagram, and 32 bits for spare.

In ICMP there is Unreachable Error sub-protocol, which contains 16 bits each of MTU (Maximum Transmission Unit) and Checksum respectively. Depending on the type of network, MTU varies from 296 bytes for point-to-point, to 1,500 bytes for Ethernet, to 65,535 bytes for Hyper-channel.

There is a 32-bit sub-protocol in ICMP devoted for Source Quench Error (SQE), which is generated by the UDP. The sub-protocol of SQE contains only 32 bits and half number of the bits is allocated to its Checksum.

The ICMP is initiated by TFTP (Trivial File Transfer Protocol), which is the corner stone communications between a client and a server. Although TFTP itself does not have a Checksum for error protection as the other protocols or sub-protocols, it contains in its format error message, error number, and ACK (acknowledgement). Basically, TFTP is a form of error detection stop and wait protocol scheme. In TFTP, there are 16 bits for ACK and another 16 bits for error Number.

As a part of the LP Datagram, the IGMP (Internet Group Management Protocol) consists of 64 bits segment for each Datagram. The format of the IGMP contains 32 bits group address and another 16 bits checksum. The other partitions 4 bits each are for different versions of IGMP and 8 bits are not used.

Each of the PPP (Point to Point Protocol) frame contains the cyclic redundancy check (CRC) field to detect errors in each frame. The CRC-16 is a 2-byte as shown in Section 4.2.2. The CRC is the same as the frame check sequence (FCS) in the Ethernet. In addition to CRC, PPP provides a way to encapsulate IP Datagrams on a serial link; and to establish, to configure, and to test the data link connections. There is a byte each for the flag in the beginning and at the end of each frame, address, and control. The 2-byte protocol designations denote the IP Datagram, link control data, and network control data.

Concerning one-to-many and many-to many user environments, the Internet Multicast Protocol (IMP) imposes additional protocol challenges in terms of both efficiency and reliability. IMP consists of the routing and transport sub-protocols. The format of IMP is shown in FIG. 3.

A set of transport protocols are required in IMP. A multicast transport protocol (MTP) is built upon layer on top of a non-multicast protocol such as UDP. The functions of MTP are: sequencing, time stamping, feedback control, and congestion controls.

The Real-Time Transport Protocol (RTP) is a transport protocol designed to provide sequencing and time stamping for multimedia applications. It is primarily used for multicast applications. RTP works by encapsulating any multi-media information into RTP packets before transmission. At the receiver, RTP stores the data and routes to the user application. The original RTP provides no reliability improvement over UDP.

The IMP routing protocol is characterized by the mode, the join-type, the network tree building method, and the tree type. The mode, either dense or sparse, refers to the receiver distribution in the network. The join-type can be either implicit or explicit. Implicitness implies that every user is a receiver by default. Explicitness indicates that users must send a join message to become a part of the tree. The tree building method can be either data-driven or a priori. The difference is that a tree is built when the first data appears, while a-priori refers to a tree building before any data is sent. The tree type can be source-based or shared. The former means a unique tree for every group, pair source; the latter refers to one tree per group and shared by all the senders.

Among the IMP routing protocols are: Distance Vector Multicast Protocol (DVP) Multicast Open Shortest Path First (MOSPF), and the Protocol Independent Multicast (PIM). All three protocols are dense mode, data-driven, and source tree type. Both DVMRP and PIM are implicit, while MOSPF is explicit.

Within each transmission protocol, the designated segment for either Checksum, or CRC, or ARQ is replaced by the corresponding specified error correcting codes to be described in the next section. Each protocol must be replaced by a forward error correcting code. Some codes can be shared by more than a protocol as specified and detailed in the following.

New Error Coding Methods

Because all protocols are block structured, the solutions required are either all block codes and/or block structured convolutional codes. For short block length, known block codes are few in number and poor in performance. Direct matching with established protocols becomes very difficult. Convolutional codes although larger in number with short constraint length and simple decoding algorithms, but continued bit streams are required in both encoding and decoding. AdHoc scheme such as bit stuff causes decoding delay, rob channel capacity, creates inefficiency, and wastes bandwidth. The first part this invention is to convert optimally any convolutional code to block codes regardless its application. The second part of this invention is to address block codes to specific Internet applications.

Block Structured Convolutional Codes

Applicable to all blockless convolutional codes with maximum likelihood (Viterbi) decoding, sequential decoding, or threshold decoding, the function of conversion from any convolutional code to block code is shown in FIG. 4, which consists of an encoder processor (Processors E-1 and E-2) at the transmission end, and a decoding processor (Processors D-1 and D-2) at the receiving end. Processor E-1 can be but need not to be identical to Processor E-2. Similarly, Processor D-1 can be but not to be identical to D-2. For illustration, the processors must be separately identified even they are identical. In FIG. 4, there are Input/Output switches exist at both the encoding and decoding processing ends. Precision counters control the switches. Without tail-biting, the operation is detailed as:

Step 0: Initially, set Encoding Processors E-1 and E-2 to zero.

Step 1: Both convolutional encoding processors E-1 and E-2 are ON by supplying identical clocks to their shift registers. Fully load Encoding Processor E-1 with information digits [A] from its input up to length $N_A(1)$.

Step 2: As E-1 is fully loaded, its input is switched to Encoding Processor E-2. with message [R]

Step 3: At the same time as Step 2, Encoding Processor E-1 output produces coded digits [A·R]

Step 4: As Encoding Processor E-1 is producing coded digits at its output, its inputs are fed all zeros $Z_1$. The number of zeros equals the value of $N_A(1)$.

Step 5: When Encoding Processor E-1 is encoding, Encoding Processor E-2 is loading with [A·R].

Step 6: When Encoding Processor E-1 completes its encoding up to $N_A(1)$ and its contents are all zero. At this time, the encoding input switch is enabled for E-2 and information digits begin to feed in continuously to E-2 again with [R]; and the Encoding Processor E-1 output is switched off.

Step 7: At this time Encoding Processor E-2 is performing the encoding process with $Z_2$ to produce [R·R], while Encoding Processor E-1 is loading.

Step 8: The number of zeros of $Z_2$ equals the value of $N_A(2)$.

Step 9: The switching encoding procedure repeats itself between $N_A(1)$ and $N_A(2)$.

The encoding procedure consists of any two convolutional encoding processors in parallel. The processor de-multiplexes the information digits at its input, and multiplexed the processed digits as single output.

In decoding with ([ ])* denotes the estimate of its content, the process is reversed as:

Step 10: Set D-1 and D-2 initially to 0.

Step 11: The received coded digits ([A·R])* are first fed into Decoding Processor D-1.

Step 12: Decoding Processor D-1 decodes with the received digits. In addition, as it decodes, locally generated zeros $Z_1$ are fed into the Processor.

Step 13: As Decoding Processor D-1 is loaded and begins decoding to produce the estimated ([A]*, incoming received digits ([R·R])* are switched to Decoding Processor D-2

Step 14: Decoding Processor D-2 performs the same function in Step 13 as for decoding Processor D-1 to recover ([R])*.

Step 15: With $N_A(1)$ and $N_A(2)$ counting, the switched decoding steps repeat as toggle.

By Steps 0-15, any convolutional code can become a block code. The procedure is simplified when processor E-1 is identical to E-2, D-1 is identical to D-2. In this case, $N_A(1)=N_A(2)$. The information A, B, A, B . . . are internally counted and blocked and not necessarily externally partitioned as shown.

If the Encoding Processors E-1 and E-2 are identical and for illustration purpose, a single encoding processor can be shown in FIG. 5(a). Which consists of two non-identical convolutional encoders, Encoder I and Encoder II. They are connected with both feedback and feed forward adders. To improve performance, an interleaving unit is inserted and a delay unit is added to spread the two encoding processing. This Encoding Processor operates as follows:

Step 1: When either input [A] or [R] is switched into the processor, the signal feeds to the Encoder I through a feedback adder.

Step 2: The same signal is delayed feed into Encoder II through interleaving and feedback addition units.

Step 3: The outputs of both Encoder I and Encoder II are added to form [A·R] or [R·R].

Step 4: The contents of both Encoder I and Encoder II are both feedback to the corresponding adders.

Figure 5B:
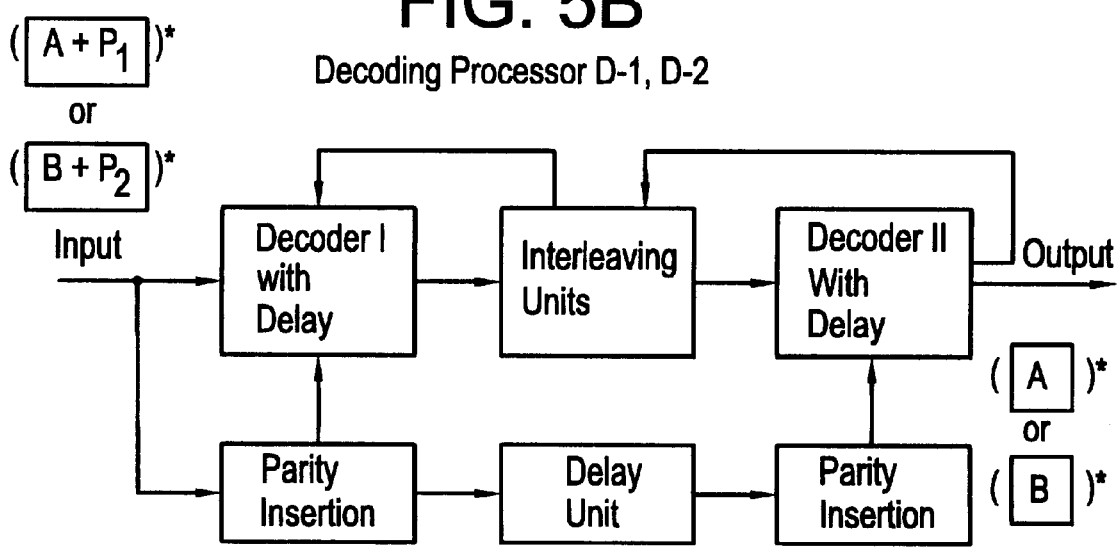
FIG. 5(b) shows the elements of the decoding conversion processor.

The two different decoding processors are shown in general in FIG. 4: Decoding Processor D-1 and Decoding Processor D-2. If the encoding processors are identical, the decoding processors have to be the same as shown in FIG. 5(b), the decoding processor consists of Decoder I and Decoder II with delay, interleaving, and parity check insertion as configured. The Decoding Processor operate as follows:

Step 1: Since the Processors are identical, the input of the Processor takes the received sequence either ([A·R]* or ([R·R])*.

Step 2: The received sequence goes into the Encoder I with delay first.

Step 3: The input sequence goes into parity checking and insertion unit.

Step 4: The output of Encoder I goes into the input of Encoder II through the interleaving units.

Step 5: Decoder II decodes the output from the Decoder I with delayed parity insertion.

Step 6: The output of Decoder II is either the estimate ([A])* or ([R])*.

As an example, a rate 0.75 double error correcting convolutional code with 3 encoding shift registers can be Encoder I. This encoder provides 4 stacks to replace the 16-bit Checksums. This Encoder I operates as follows:

Step 1: This Encoder I requires 1:3 serial to parallel bit conversion before input to the encoder.

Step 2: This Encoder I consists of 3 shift registers with maximal stages of 13, 18, and 19 respectively. A common clock advances all three registers simultaneously.

Step 3: Encoder I takes $\boxed{A}$ as input.

Step 4: $P_c$ is the parity check bit and i, j, and k are the information bits.

Step 5: For each clock duration, a block of output bits are formed and they need to convert from parallel to serial before going into for the feed-forward addition as shown in FIG. 5(a).

Figure 6:
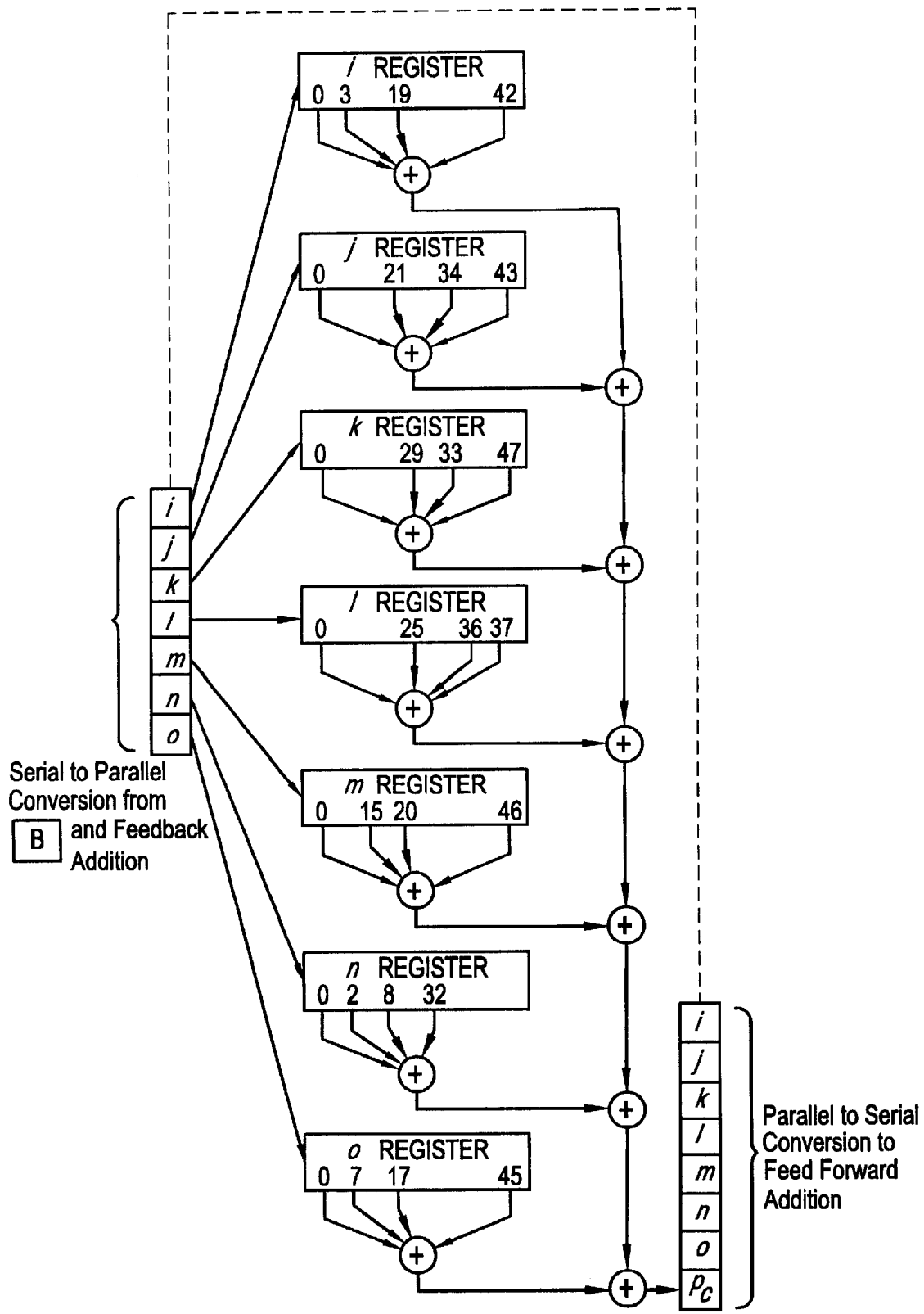
FIG. 6 shows a second encoder inside the encoding processor.

An Encoder II inside Encoding Processor either E-1 or E-2 is shown in FIG. 6 as an example, which provides 2 stacks for Checksums replacement. Instead of 3, there are 7 registers in this encoder with register lengths as indicated. The operational steps are similar to that of Encoder I as described above with $\boxed{R}$ instead of $\boxed{A}$ as its input.

Once the encoders (Encoder I and Encoder II) are determined, the corresponding decoders (Decoder I and Decoder II) can also be determined.

Block Codes

Due to variations in protocol requirements, the following eight block codes are described in terms of Internet Transmission Protocols:

Codec-1: The generator polynomial of this code is derived as:

$$G_1(x) = 1 + x^4 + x^5 + \ldots + x^{12} + x^{15} + x^{16}, \tag{3}$$

And the corresponding parity check polynomial is, $$H_1(x) = 1 + x^4 + x^5 + \ldots + x^{13} + x^{14} + x^{15} \tag{4}$$

This codec is used for single TCP/IP User Datagram, IMP, and portion of IGMP.

Codec-2: With two minimum polynomials this code is used in the protocols of UDP Header, ICMP Unreachable Error Fragmentation, ICMP Square Quench Error Frame, ICMP and TFIP message formats, ICMP Re-direct Message, ICMP messages for echo request and echo reply, and ICMP Time Exceed ed Message protocols. The code has the generator and parity check polynomials as:

$$G_2(x) = 12 \ldots 71 \tag{5}$$

$$H_2(x) = 125344 \ldots 13171. \tag{6}$$

Codec-3 For single stack transmission, this code takes care not only the TCP Header, but also the IP Header protocols. This modified code is unique and it appears that no other code in existence can match. The code compatibility has been evaluated, the code has 160 bits code length.

Codec-4 This is a block code of block length n=256 and message information bits k=224. The code is modified from the primitive BCH (255. 223, 9) code. The code has the corresponding generator polynomial in octal representation, $$G_4(x) = 75626641375 \tag{7}$$

Codec-5 This block code has length n=512 and k=480, which is extended from the (511, 484, 7) code. Note that the error correcting capabilities of both Code-4 and Code-5 have not changed after the extension. The code is specified by the following polynomial:

$$G_5(x) = 1530225571 \tag{8}$$

Both Code-4 and Code-5 are reserved and can be used for multiple stacked protocols.

Code-6 This code is the product of eight (8) minimum polynomials of degree 10: The generator polynomial of Codec-6 is, $$G_6(x) = 1 + x^2 + x^5 + x^6 + x^7 + x^{10} + x^{11} + x^{15} + \tag{9}$$
$$x^{17} + x^{20} + \ldots x^{34} + x^{39} + x^{40} + x^{41} + x^{43} + x^{45} +$$
$$x^{47} + x^{48} + x^{51} + x^{52} + x^{53} + x^{54} + x^{56} + x^{58} + x^{61} +$$
$$x^{65} + x^{68} + x^{69} + x^{70} + x^{71} + x^{76} + x^{77} + x^{78} + x^{79} + x^{80}$$

The corresponding parity check polynomial for Codec-6 is, $$H_6(x) = 1 + x^2 + x^6 + x^8 \ldots + x^{79} + x^{82} + x^{83} + x^{84} + x^{86} \tag{10}$$

Codec-6 is designed for five (5) consecutive TCP/IP User Datagrams.

Codec-7 The generator polynomial of this code, in terms of its exponents, is, [0,1,3,4,5,11,14,17,18,22,23,26,27,28, 32,33,35,37,39,41,43,45,47,48,51,52,55, 59,62,68,70,71, 72,74,75,76,79,81,83,88,95,96,98,101,103,105,106,108, 111,114, 115,116,120,121,122,123,124,126,129,131,132, 135,137,138,141,142,146,147, 149,150,151,153,154,155, 158,160,161,164,165,166,167,169,174,175,176,177, 178, 179,180,181,182,183,184,186,188,189,191,193,194,195, 199,200,201,202, 203,208,209,210,211,212,214,216,222, 224,226,228,232,234,236,242,244,251].

Codec-7 is different from the previous codecs and is designed for 15 consecutive Internet protocols. When a transmission channel exhibits relative few errors, the codec provides further efficiency improvement. The decoder operation is described in steps as:

Step 1. Reset both syndrome and message shift registers to zero.

Step 2. With input control, shift information bits into the registers.

Step 3. Disable the input control gate and shift the parity check bits into The syndrome register. During this time the message register remains stationary Step 4. Shift information bits for both syndrome and message registers. Error correction takes place through the exclusive-OR gate as each bit shifts out from the message register.

Step 5. The procedure is repeated for the next block.

Code-8 With 12 stacks, the (273, 192) modified decoder with soft decision can expect a decoding error rate of $10^{-6}$ at $E_b/N_0$ of 4.3 dB.

Codec Test Configuration

Figure 7A:
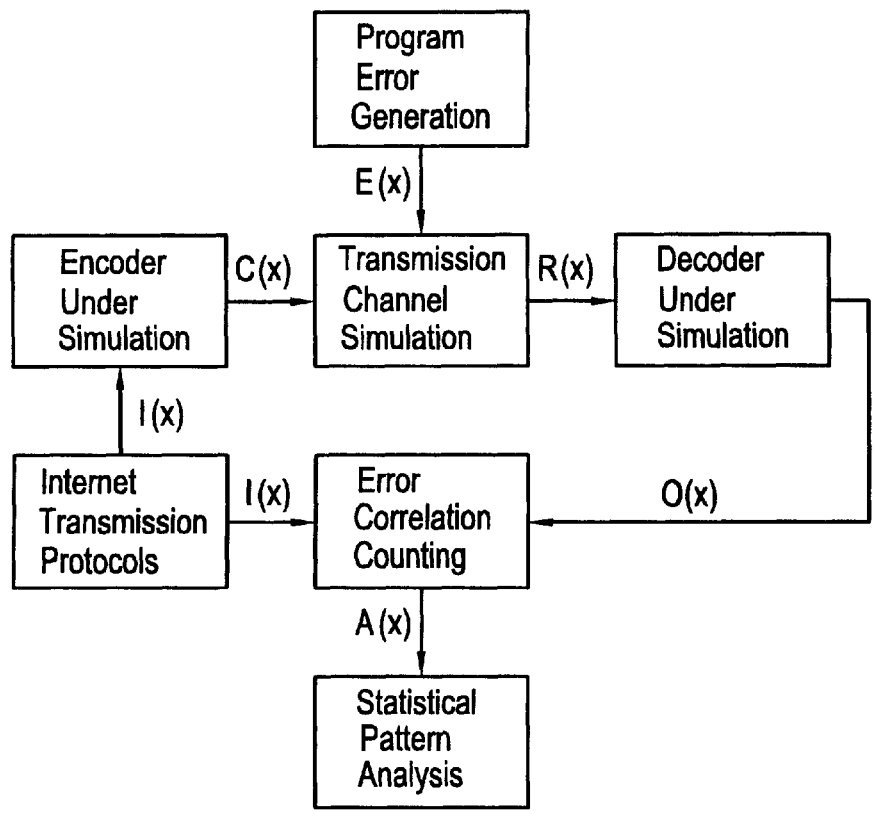
FIG. 7(a) is the test configuration diagram.
Figure 7B:
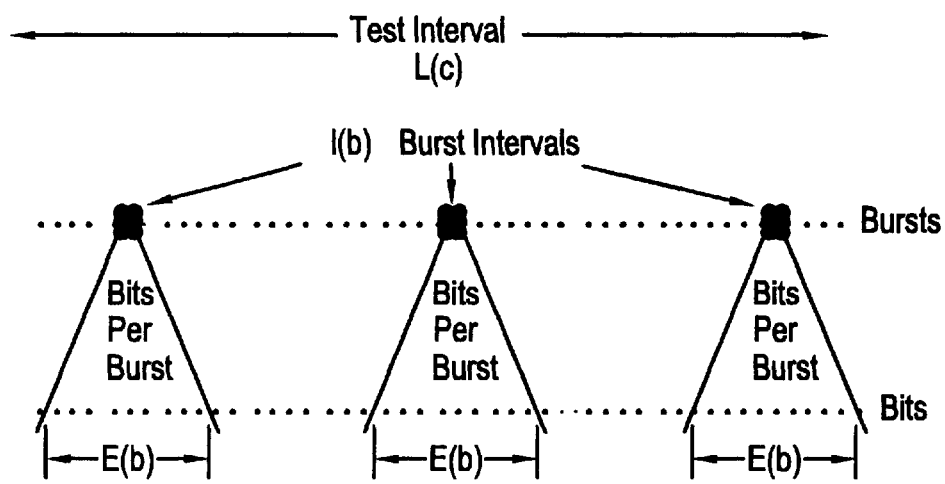
FIG. 7(b) shows the deterministic programmable error pattern generation.

The invention software allows a user to encode and decode any code for which an encoder and decoder have been programmed. The program has four subsections: encoder setup, decoder setup, test configuration and error analysis. The test configuration is shown in FIG. 7(a), which consists of an Internet message generator, a programmable error generator, a channel simulator, an error correlator, and a statistical error pattern analyzer. The deterministic programmable error generation function is shown in FIG. 7(b).

The function of each testing component is described separately as follows:

Internet Message Generation (IMG)

The IMG Module is a collection of formatted various Internet protocol sub-modules. These sub-modules are: the TCP Header, the IP Header, the Point-to-Point Protocol Frames, the Internet Group Management Protocol (IGMP), the Internet Control Message Protocol (ICMP), the User Data Gram Protocol (UDP), the Delay Protocol, and the Trivial File Transfer Protocol (TFTP). For the collection of IMG, it is designed as I(x).

Programmable Error Generation (PEG)

The PEG Module provides pre-programmed specific error patterns E(x). As shown in Figure these patterns are specified by the number of bit error per burst E(b), the intervals between bursts I(b), and the total number error producing duration L(c). The purpose of such controlled error generation are to: (a) investigate the reliability of the decoder under testing in terms of consistency; (b) observe the decoder error producing phenomena beyond its minimum distance capability.

Statistical Error Pattern Analysis

By keeping track of all the counters, the uncorrectable error patterns may be obtained to show how often the number of bits per burst, the error burst occurrence intervals. These patterns can be merged as a set of histograms.

The final section of this program is the error analyzer. There are currently two statistics that are measured, burst lengths and burst intervals. Burst lengths refer to the number of consecutive bit errors before a non-erroneous bit is encountered. The burst interval statistic measures the number of bits between two successive bursts. The two buttons, Plot Intervals and Plot Durations draw the corresponding graph in the main window. Most test results obtained come from this Module.

Error Correlator

The purpose of the Error Correlator is to compare bit by bit the input message sequence I(x), or IMG to the encoder to the output sequence O(x) of the decoder. Since there is a delay in the process of encoding and decoding, a delay unit is introduced to account for the timing required in coding and decoding. If there is no error or all errors have been corrected, the output of the Correlator will be all zeros.

The Correlator is a simple Modulo-2 adder. If the corresponding output bit in O(x) differs from that of the I(x), a 1 appears at the output of the Correlator A(x).

Error Counter

For error analysis, three counters are necessary at the output of the Correlator: a counter to count the number of bits per error burst, a counter for counting the intervals between two bursts in bits, and a counter for counting the overall duration of the test. For each test, the total number of channel errors, regardless of distribution pattern, and the total number of uncorrectable errors are displayed in the two respective windows.

PROCEDURES OF CALCULATION, EVALUATION, AND COMPARISON

To substantiate the impact and support the significance of the claims, a sample comparisons and evaluations are described in terms of with and without the invention.

The False and Miss Detection Error Measures of Checksums

As mentioned, error detection in the Internet depends on the 16-bit Checksum arrangement. The question is what kind of error performance in general can be expected from such arrangement. In general, there are two types of error phenomena in any detection process. The false detection and the miss detection. Their respective measures are the false detection error probability and the miss detection error probability. Such performances criteria are separately discussed below:

Checksum Miss Error—Sequence miss detection occurs when a sequence is not recognized at the receiver, even the sequence was transmitted. Miss error detection is caused by enough transmission errors such that the receiver fails to detect the sequence completely. If p is the transmission channel bit error rate, the error probability due to miss detection with a sequence of length n bits is, $$p_m = \sum_{i=t_E+1}^{n} [nCi] p^i (1-p)^{n-i} \quad (11)$$

Where [ n C i ] denotes n combination i, $t_E$ is the number of threshold errors in the node in order to detect the cell. $t_E$ is the number of bit differences between the received sequence and the structure of the Checksum. The binomial expression signifies the binary nature of the error phenomenon. With $t_E$ as parameters, $p_m$ versus p is shown in Table 1 Comparisons are made with and without forward error corrections.

Checksum False Error—A false error is committed when a sequence is detected at the receiver, but in fact the sequence was not sent. This error event occurs when a received sequence structure matches with a valid sequence structure. With $t_E$ as the number of tolerable errors, the false error probability is, $$P_F = \frac{[\text{Number of sequences look like Checksum after } t_E \text{ variations}]}{[\text{Number possible sequences}]} = \frac{\sum_{j=0}^{t_E} [nCj]}{2^n} \quad (12)$$

A $P_F \approx 0.5$ without forward error correction can be converted to an improved error rate $P_F' = 10^{-6}$ with a 4-error correcting FEC.

TABLE 1

A Checksum Miss Detection Probability Comparison with and without FEC

| Transmission Channel Bit Error Rate p | $10^{-5}$ | $10^{-4}$ | $10^{-3}$ |
|---|---|---|---|
| Checksum without FEC | $9 \times 10^{-3}$ | $5 \times 10^{-2}$ | $2 \times 10^{-1}$ |
| $P_m$ with single FEC | $10^{-7}$ | $10^{-5}$ | $10^{-3}$ |
| $P_m$ with double FEC | $5 \times 10^{-10}$ | $10^{-8}$ | $10^{-5}$ |

TABLE 2

| $N_n$ | 50 | | | | | 80 | | | | |
|---|---|---|---|---|---|---|---|---|---|---|
| $N_p$ | 5 | 10 | 20 | 30 | 40 | 5 | 10 | 20 | 30 | 40 |
| η(ARQ) in % | 47 | 42 | 40 | 39 | 36 | 78 | 75 | 66 | 62 | 59 |
| η(FEC) in % ratio | 95 | 90 | 84 | 81 | 74 | 95 | 90 | 84 | 81 | 74 |

TABLE 3

| | Bandwidth (BW) Saving in terms of Erlang Traffic ($E_rT_r$) and Blocking Probabilities (PBK) | | | | | | | | | | | |
|---|---|---|---|---|---|---|---|---|---|---|---|---|
| BW | 240 MB | | | | 6,000 MB | | | | 98,000 MB | | | |
| $E_rT_r$ | 168 | 120 | 72 | 48 | 168 | 120 | 72 | 48 | 168 | 120 | 72 | 48 |
| $P_{BK}$ | $2 \times 10^{-2}$ | $4 \times 10^{-3}$ | $2 \times 10^{-3}$ | $10^{-4}$ | 0.4 | 0.1 | 0.02 | $4 \times 10^{-3}$ | — | ≈1.0 | 0.4 | 0.1 |

Efficiency Measures with Error Detection and Re-transmission Let the throughput efficiency of any error detection and re-transmission (ARQ) scheme be denoted as $\eta_{(ARQ)}$, which is the product of the following three factors: re-transmission rate, transmission delay, and rate reduction due to coding.

$$\eta_{(ARQ)} = \text{(re-transmission rate)(transmission delay)(coding rate)} = \eta_r \eta_t \eta_c \quad (13)$$

Let T be the total number of transmitted sequences, $N_n$ the number of received sequences without error, $N_p$ the number of repeated sequences due to ARQ, R the encoding rate, P is the probability of at least one sequence in error, and p the transmission channel bit error rate. Then, $\eta_t = [1/(t+1)]$, where t is the normalized round trip delay to and from a Internet transmission link; $\eta_c = R$, and $$\eta_r = [N_n/T] = [(T-N_p)/T] = 1-PN_p. \quad (14)$$

Thus, $$\eta_{(ARQ)} = \eta_r \eta_t \eta_c = (1-PN_p)[1/(t+1)]R \quad (15)$$

Since the number of repeated sequences is $N_p$, when errors occur during transmission, all the error detected sequences can be corrected, and there is no need to repeat, $N_p \beta\ 0$, which implies the repetition part of the throughput efficiency $\eta_r \rightarrow 1$ as the limit. This is precisely the justification of the throughput efficiency improvement. If $N_I$, is the number of initial transmitted sequences, the amount of throughput change can be calculated as, $$\Delta\eta = \eta_{(ARQ)}/\eta_{(FEC)} = [N_n/(N_I+N_p)]/(N_n/N_I) = N_I/(N_I+N_p). \quad (16)$$

The amount of efficiency improvement is, $\eta = [1-(1/\Delta\eta)]$.

An enumeration of efficiency is shown in Table 2, where efficiency improvement with respect to $N_p = 5, 10, 20, 30$, and 40; and with $N_n = 80$ and 50 as parameters. The number of re-transmissions depends on the transmission channel condition at that time. Regardless of the channel condition, as the example indicates that FEC out performs ARQ in terms of efficiency. As re-transmission is minimized or eliminated, traffic congestion due to repeated transmission disappears.

EFFICIENCY ENHANCEMENT

Traffic Measures

Traffic measure refers to the reference and standard of a message quality in a congestive environment. The recognized measure in traffic engineering is the unit of Erlang (in honor of the Danish traffic theorist Agner Krarup Erlang). An Erlang is defined as the ratio of total utilization time of an equipment or a device to a given time duration. An Erlang is also defined as the ratio of successful traffic carrying to total traffic offered. The difference between the two is called traffic lost. Internet traffic has no exception, both the traffic carrying and traffic offered are statistical phenomena; and they can be described probabilistically in terms of known distributions. Due to worldwide Internet traffic of different time zones, peak traffic observation and pro-rated time series analysis can be useful tool for Internet traffic analysis.

Probability of Congestion

The quality of service in traffic engineering is through the formulation of congestion probability, which depends on the network condition, user traffic intensity, and number of users, number of servers, and the traffic offering capacities of the servers. A limiting measure of congestion probability is the blocking probability, which will be used against Erlang traffic.

Re-transmissions in Internet Traffic

To ease the blocking probability computation in the generalized Internet resource sharing environment, the following approach may be used: a client requiring b message units is blocked if and only if fewer than b units capacity of the server is available at that time. Assume the Internet has k types of services and each service has its distinct requirement in terms of bandwidth and time utilization. A message type is said to be blocked, if the server can no longer allocate the bandwidth required by the client at the time of request. When a particular type of message service is blocked, the Internet system has no provision for storage and the service is no longer considered until some later time for re-transmission. This is first kind of re-transmission, which is due to traffic blocking.

The second kind of re-transmission in the Internet is due to either error or interference in the transmission link. This situation can happen even when there is no traffic congestion. These two issues are addressed separately in the following subsections.

Re-transmission due to Congestion

Assume a group $n_i$ messages of type i, which requires $b_i$ bandwidth each for $t_i$ duration, is refused to be accessed to the Internet. Let this probability be denoted as $p(b_i, n_i)$, let j=nxb, where j is total network bandwidth, n and b are the collections of number of type messages and the combined bandwidth requirement at that time. It is obvious that j=nxb<c, where c is the network capacity. Then, the probability $p(b_i, n_i)$ is the ratio of the quantity $$\prod_{i=1}^{k} [a_i \exp(n_i)/n_i!]$$

with summations ratio of j=nxb to n.

The system utilization is the ratio of carried traffic to the traffic offered, i.e. U=Lc/Lo. Where Lo is sum of the product ($a_i b_i$ for i is summed from 1 to k. $a_i$ is the amount of traffic offered to type i.

$$Lc = \sum_{i=1}^{k} (a_i b_i)[1 - p(b_i, n_i)] \quad (17)$$

Assume an Internet service provider has a capacity of c=100 Giga-Bytes at a particular time, and there are three types of traffic parcels. The number of bandwidth required by each type is 240 MB, 6,000 MB, and 89,000 MB. If the offered load or offered traffic for each type is the same, $a_i = Lo/kb_i$. The blocking probabilities for the requiring bandwidths are shown in Table 3 in terms of total traffic offered in Erlangs. For all the bandwidth requirements, the table shows that the blocking probability increases as Erlang traffic increasing. For a given Erlang traffic the corresponding blocking probabilities increase faster with higher bandwidth clients. The table also shows the average network utilization varies as the blocking probabilities change. Next, what needs to be demonstrated is how Erlang traffic can be improved for a given blocking probability.

Traffic Improvement without Re-transmission of Checksum

From the simple example of Table 3 the bandwidth required in each case includes the provision of re-transmission due to checksum arrangement in the existing Internet protocols. If the required bandwidth for re-transmission can be reduced, it is shown in Table 3 that the Erlang traffic can be improved for any given blocking probability. Except in the extreme case of very large bandwidth client, as in the case of bulk data transfer, the Erlang traffic approaches unity as shown without checksum re-transmission.

TRANSMISSION MODEL AND CHANNEL CAPACITY

Figure 8A:
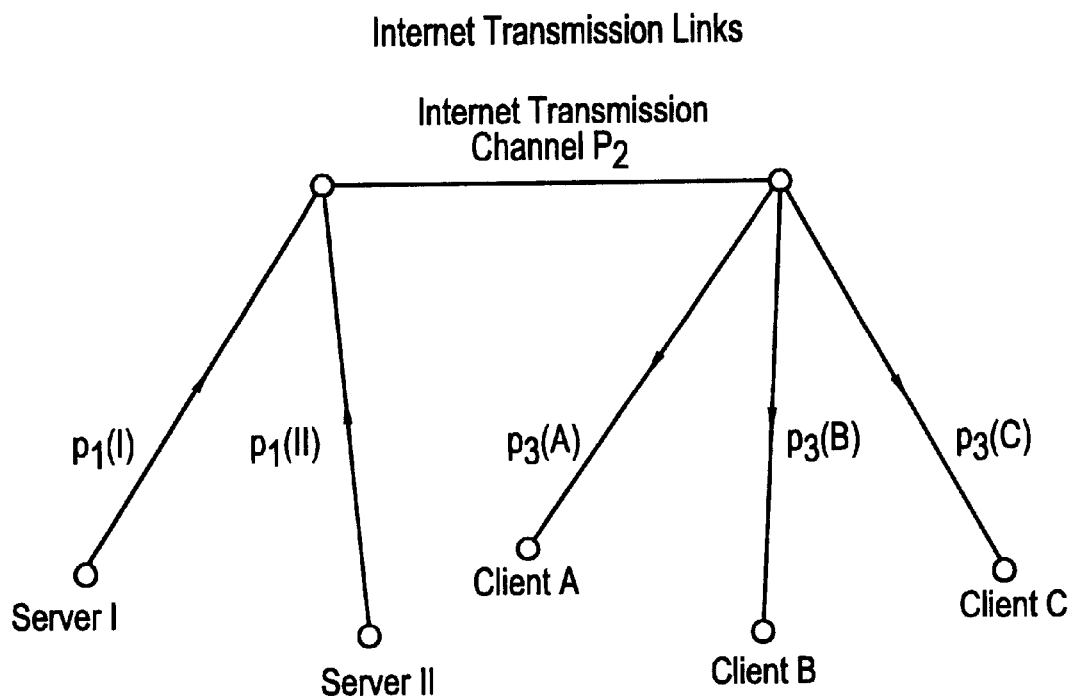
FIG. 8(a) is a simplified Internet transmission links between a set of Internet service providers (servers) and a set of users (clients).
Figure 8B:
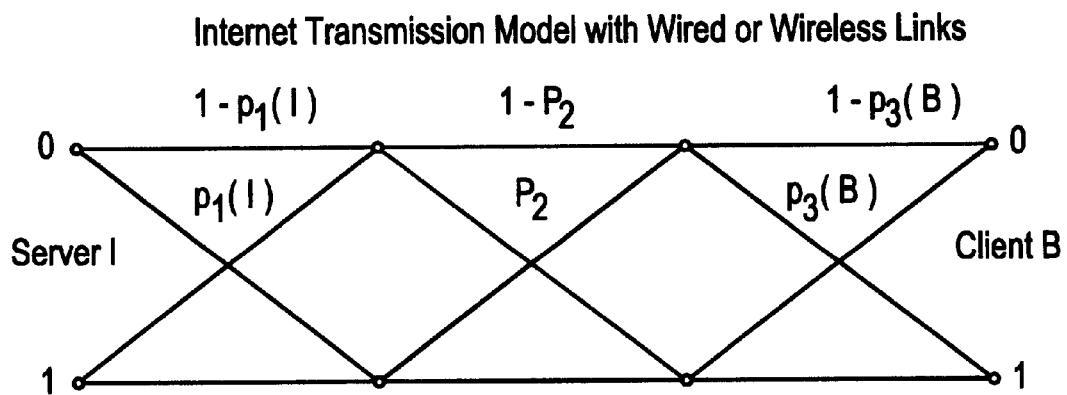
FIG. 8(b) is an Internet transmission model

The Internet network can be simply modeled in terms of client/server relation and the corresponding link error rates as shown in FIG. 8(a). Internet transmission includes wired and wireless media. Regardless whether the transmission media is fiber optical cable, or satellite, or signaling through telephone lines, modems, amplifiers, converters, earth stations, immediate frequencies (IF), or radio frequencies (RF), the net result in Internet transmission is a series of binary signaling. Depending the number of servers in a signaling link, the Internet transmission can be modeled as a set of binary channels in cascade. If the channels, or some of them, are symmetric, they reduce to cascade binary symmetric channels (BSC) as shown in FIG. 8(b). As the Internet message path connections increases, the number of BSC stages increases accordingly. If any of the segment channels are not symmetric, only the transitional probability of each channel is different.

Internet traffic travels through more than a single network, a transmission link between two network providers is a channel segment and specified by its corresponding transitional probabilities. The cascade connections can be extended to as many as the number of ISPs in the transmission links.

Figure 9:
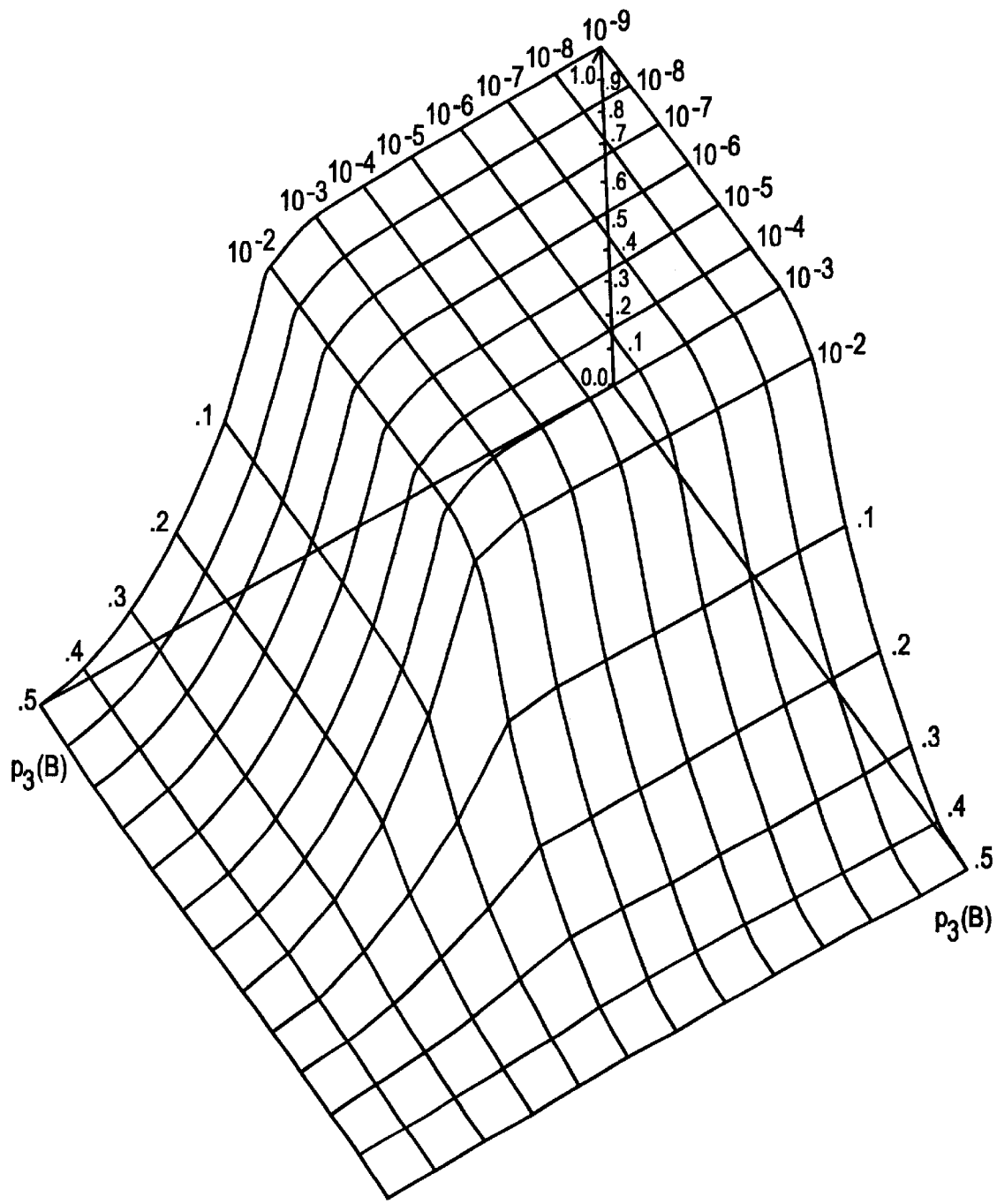
FIG. 9 is a sample of Internet channel capacity evaluation based on three-transmission segment.

For illustration, FIG. 9 provides the channel capacity of a three simple channel segment in cascade. The three segments are: from a server to the first network node, from the first node to a second node, from the second node to the client. Each segment contributes a transitional probability, and the combination becomes a three-dimentional structure as shown. For wireless and/or interference prone Internet transmission, the channel characteristics need not to be Gaussian.

Summing up from Sections IX to XI, the following are evident:

Bandwidth Conservation

With every increasing Internet activity, bandwidth becomes scarcer. Re-transmission requires not only additional bandwidth in the forward channel, but also the necessary bandwidth in the return channel. With forward error correction, no return channel bandwidth is necessary, and no additional bandwidth is required for re-transmission in the forward channel.

Reduced Traffic Congestion

A significant part of the Internet traffic has been devoted to re-transmission. As re-transmission is replaced by forward error correction, Internet traffic congestion is eased.

Efficiency Enhancement

In present Internet operation, efficiency is limited among other factors by the Checksums contained within each of the Internet transmission protocols. Whenever a transmission error(s) or interference is encountered, re-transmissions are initiated. Re-transmission decreases efficiency. With the specific compatible forward error correcting codes described, re-transmission is eliminated.

Delay Reduction

Re-transmission causes message delay. Elimination of re-transmission reduces delays.

Reliability Improvement

Present Internet reliability depends on the reliable detection of the set of Checksums within the set of Internet transmission protocols. Without error correction, the Checksum performances, in terms of false and miss detection probabilities, are formulated and evaluated. With error correction of the specific codes, the performances are significantly improved.

Transmission Channel Capacity Amelioration

When re-transmission is eliminated, the transmission channel capacity is automatically improved. The amount of improvement depends on the error rates of the Internet network segments. A method of capacity evaluation is described in detail in Section.

Speed Increase

In addition to device limitations such as modem, transmission speed is hindered due to re-transmission of the same message. As error correction replaces error detection, transmission speed increased.

The amount and degree of bandwidth conservation, capacity amelioration, efficiency enhancement, delay reduction, reliability improvement, speed increase, and traffic easement depend on the protocol applied, transmission channel condition, and the selected codes, including the number of stacks. Simple examples are included for illustrations.

I claim:

1. A method of information transmission comprising providing transmissions with transmission protocols having forward error correcting codes, receiving the transmissions with the transmission protocols and the forward error correcting codes, optimally converting convolutional codes to block structures block codes, decoding the forward error correcting codes and decoding, checking and correcting the received transmissions with the decoded forward error checking block codes.

2. The method of claim 1, further comprising simultaneously enhancing efficiency and throughput of transmissions, conserving bandwidth occupancy, minimizing message delay, increasing signaling speed, preventing traffic congestion, and improving reliability of the transmissions.

3. The method of claim 1, wherein the transmissions are transmitted over a worldwide transmission web with wired or wireless transmission media.

4. The method of claim 3, wherein the forward error correcting block codes are incorporated in transmission headers without changing or modifying any formats and structures of Internet transmission standards, which have been established as Internet Transmission Protocols by IETF (Internet Engineering Task Force), ITU-T (International Telecommunications Union-Technical), and the Internet Society.

5. The method of claim 4, wherein the forward error correcting block codes provide ARQs, CRCs, and Checksums replacements.

6. A method of information transmission comprising providing transmissions with transmission protocols having forward error correcting codes, receiving the transmissions with the transmission protocols and the forward error correcting codes, decoding the forward error correcting codes and decoding, checking and correcting the received transmissions with the decoded forward error checking codes, wherein the forward error correcting codes provide ARQs, CRCs and Checksums, and wherein the providing comprises optimally converting convolutional codes to block structures block codes.

7. The method of claim 6, wherein the converting comprises two parallel switched Encoding Processors and two parallel switched Decoding Processors.

8. The method of claim 7, wherein the converting comprises two additional two non-switched Encoders within each Encoding Processor and two additional non-switched Decoders within each Decoding Processor.

9. The method of claim 8, wherein the Encoding or Decoding Processors can be the same or different, the Encoders and Decoders can be identical or different.

10. The method of claim 6, wherein the converting further comprises providing a set of eight specific block codes, encoders and decoders pairs for meeting all the Internet transmission standards.

11. The method of providing error correction in Internet Transmission Protocols comprising providing forward error correction block coding to Application Layers, Transport Layers, Network Layer and Link Layers in a transmitting end, transmitting information and protocols with forward error correction block coding from the Application Layer to the Transport Layer, from the Transport Layer to the Network Layer, from the Network Layer to the Link Layer and from the Link Layer through the transmission channel, and providing forward error correction decoding in a receiving end to a receivina Link Layer.

12. The method of claim 11, further comprising providing the forward error correction decoding to a receiving Network Layer, to a receiving Transport layer and to a receiving Application layer, and correcting errors in the receiving Link Layer.

13. The method of claim 12, further comprising providing the forward error correction decoding to a receiving Transport Layer, the receiving Network Layer, and the receiving Application Layer and correcting errors in each of the receiving layers.

14. A method of Internet information transmission comprising providing transmissions with transmission protocols having forward error correcting block codes, transmitting the transmissions with the transmission protocols and the forward error correcting block codes over the Internet, receiving the transmissions with the transmission protocols and the forward error correcting block codes, decoding the forward error correcting block codes and decoding and checking the received transmissions with the decoded forward error correcting block codes.

15. The method of claim 14, further comprising correcting errors in the information in the received transmissions with the forward error correcting block codes.

* * * * *